(12) United States Patent
Yang et al.

(10) Patent No.: US 7,768,320 B1
(45) Date of Patent: Aug. 3, 2010

(54) PROCESS VARIATION TOLERANT SENSE AMPLIFIER FLOP DESIGN

(75) Inventors: Ge Yang, Pleasanton, CA (US); Hwong-Kwo Lin, Palo Alto, CA (US); Charles Chew-Yuen Young, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 5 days.

(21) Appl. No.: 11/943,455

(22) Filed: Nov. 20, 2007

(51) Int. Cl.
*G01R 19/00* (2006.01)
*G11C 7/00* (2006.01)
*H03F 3/45* (2006.01)

(52) U.S. Cl. .................. 327/55; 327/54; 327/215; 365/205; 365/208

(58) Field of Classification Search ............ 327/51–56, 327/203, 208, 210–215, 218; 365/154, 156, 365/205, 207, 208
See application file for complete search history.

(56) References Cited

U.S. PATENT DOCUMENTS

| 6,107,853 | A * | 8/2000 | Nikolic et al. ............... 327/217 |
| 6,191,620 | B1 * | 2/2001 | Lattimore et al. .............. 327/55 |
| 2002/0075053 | A1 * | 6/2002 | Ganesan ...................... 327/218 |
| 2008/0042713 | A1 * | 2/2008 | Ahmadi ....................... 327/218 |

* cited by examiner

*Primary Examiner*—Lincoln Donovan
*Assistant Examiner*—Brandon S Cole
(74) *Attorney, Agent, or Firm*—Patterson & Sheridan, LLP

(57) ABSTRACT

One embodiment of the present invention sets forth a sense amplifier flop design that is tolerant of process variation. Specific staging of signal transitions through the sense amplifier flop circuit eliminate operational phases involving short-circuit currents between n-channel field-effect transistors (N-FETs) and p-channel field effect transistors (P-FETs) in a complementary-symmetry metal-oxide semiconductor process. By eliminating short-circuit currents between N-FETs and P-FETs within the sense amplifier flop, a large variation in conductivity ratio between N-FETs and P-FETs may be tolerated by the sense amplifier flop. This tolerance to conductivity ratio translates to a tolerance for process variation by the sense amplifier flop circuit.

20 Claims, 8 Drawing Sheets

PROCESS VARIATION TOLERANT SENSE AMPLIFIER FLOP DESIGN

BACKGROUND OF THE INVENTION

1. Field of the Invention

Embodiments of the present invention relate generally to integrated circuit sense amplifier design and more specifically to a process variation tolerant sense amplifier flop design.

2. Description of the Related Art

Integrated circuits frequently employ certain common system building block circuits, such as logic gates, memories blocks, and other specialty circuits to construct the overall system functionality of a given integrated circuit. Process variation associated with the manufacture of integrated circuits generally imparts some variation in the operation of the individual circuit elements as well as larger circuit structures within a given integrated circuit. For example, if the fabrication of a given complementary-symmetry metal-oxide semiconductor (CMOS) wafer results in highly resistive ("slow") p-channel field-effect transistors (P-FETs), then circuits that incorporate P-FETs will tend to be characterized by slow positive-going voltage slew rates relative to circuits fabricated on wafers that include highly conductive ("fast") P-FETs. Process variation in n-channel field-effect transistors (N-FETs) has a similar effect in pull-down performance.

Certain types of CMOS circuits, such as conventional combinational logic gate circuits, tend to be highly robust in maintaining correct function when subjected to process variation. For example, many static logic gate circuits produce correct output values over a very wide range of process variation, with only the input to output propagation delays and output slew rates being significantly impacted by process variation. However, many types of specialty circuits commonly used in CMOS integrated circuits generally require relatively well bounded process variation to function correctly. These specialty circuits offer a very efficient implementation of a specific building block function, but certain classes of these specialty circuits malfunction catastrophically with sufficient process variation.

One type of specialty circuit is a flop-flop (or just "flop") based on a differential sense amplifier structure. Conventional sense amplifier flop designs offer certain benefits over alternative design regimes. However, the differential structure commonly employed in the sense amplifier flop design is typically sensitive to process variation. In fact, conventional sense amplifier flop designs are prone to malfunctions due to process variation. Specifically, these differential structures require a bounded conductivity ratio between N-FETs and P-FETs within a given integrated circuit. This conductivity ratio is dictated by the process outcome for a given wafer. When the process outcome for a given wafer produces a conductivity ratio that is out of bounds for at least one sense amplifier flop within an integrated circuit on the wafer, all integrated circuits fabricated on the wafer are likely to malfunction and fail manufacturing tests, resulting in a complete loss the wafer. When a set of different integrated circuits incorporates a sense amplifier flop design that may be highly sensitive to process variation, every instance of the sense amplifier flop in every different integrated circuit design may be highly susceptible to failure, resulting in a costly overall loss of yield over many different designs and many different wafers.

One approach to improve sense amplifier flop reliability is to tighten process variation requirements on host wafers. However, such an approach tends to involve significant expense in the fabrication process and inherent yield loss during wafer sorting and qualification testing.

As the foregoing illustrates, what is needed in the art is a high-performance sense amplifier flop design that is substantially insensitive to process variation.

SUMMARY OF THE INVENTION

One embodiment of the present invention sets forth a process variation tolerant sense amplifier flip-flop circuit. The circuit has a differential subsystem that includes a first path to ground, a second path to ground, a third path to ground, and a fourth path to ground, and a control subsystem configured to control the second path to ground via a first N-channel field effect transistor (N-FET) and the third path to ground via a second N-FET, where the second path to ground or the third path to ground is enabled based on a delayed representation of an input data signal produced by the control subsystem.

One advantage of the disclosed circuit is that it eliminates short-circuit currents between N-FETs and P-channel field effect transistors (P-FETs) by specifically staging transitions within the sense amplifier flop. By avoiding short-circuit currents within the flop, the need to tightly control N-FET versus P-FET conductivity is substantially reduced, thereby increasing overall tolerance of process variation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
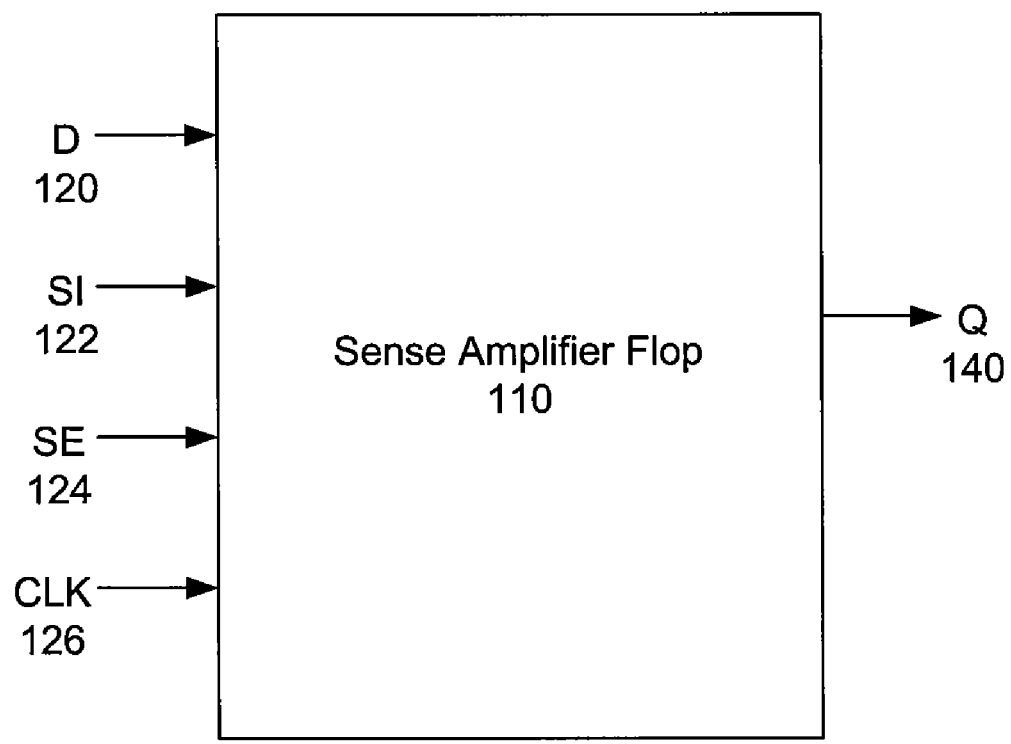
FIG. 1, illustrates the input/output ports of a sense amplifier flop with scan-in and scan enable inputs, according to one embodiment of the invention.

FIG. 1, illustrates the input/output ports of a sense amplifier flop 110 with scan-in and scan enable inputs, according to one embodiment of the invention. From an external port perspective, the sense amplifier flop 110 behaves as a generic flip-flop. Persons skilled in the art will understand that a clock signal, CLK 126, determines when the sense amplifier flop 110 samples a data signal, D 120. A transition from a logic "0" to a logic "1" on CLK 126 causes a sense amplifier flop 110 that is positive-edge triggered to sample and hold the logic level present on D 120 at the time of the positive edge on CLK 126. The sampled value for D 120 is held on output Q 140. When the scan enable input SE 124 is asserted (logical "1"), the sense amplifier flop 110 samples data from the scan in, SI 122, rather than the data input D 120. In both cases, the sampled data is presented on output Q 140.

Figure 2A:
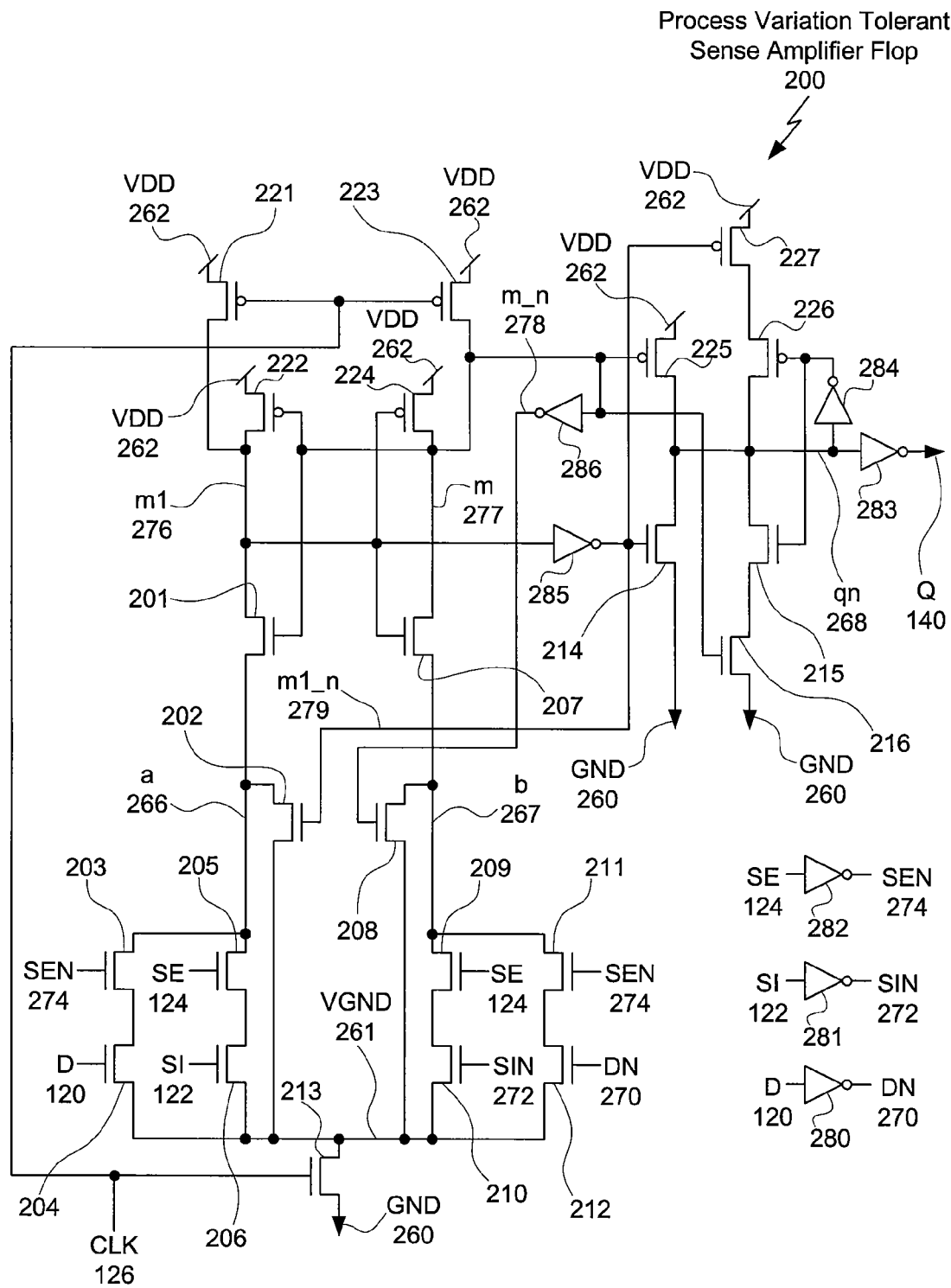
FIG. 2A illustrates the circuit design of a process variation tolerant sense amplifier flop with scan-in and scan-enable inputs, according to one embodiment of the invention.

FIG. 2A illustrates the circuit design of a process variation tolerant sense amplifier flop 200 with scan-in and scan-enable inputs, according to one embodiment of the invention. The process variation tolerant sense amplifier flop 200, or simply "flop" 200, includes four inputs and one output. The four inputs include a clock input (CLK 126, from FIG. 1), operational data input (D 120), scan data input (SI 122), and scan enable input (SE 124). As described in FIG. 1, flop 200 generates a data output signal (Q 140), which is an edge-sampled copy of input D 120.

For each input signal D 120, SI 122, and SE 124, a corresponding negative sense or "inverted" signal is generated. Input D 120 is inverted by inverter 280 to generate DN 270, a negated version of D 120. Input SI 122 is inverted by inverter 281 to generate SIN 272, a negated version of SI 122. Input SE 124 is inverted by inverter 282 to generate SEN 274, a negated version of SE 124.

N-FETs 203, 204, 205, and 206 form a first pull-down path through a differential structure, while N-FETs 209, 210, 211, and 212 form a second pull-down path through the differential structure. Within the first pull-down path, either N-FETs 203 and 204 or N-FETs 205 and 206 may be active at the same time. Within the second pull-down path, either N-FETs 209 and 210 or N-FETs 211 and 213 may be active at the same time. In a first scenario where SE 124 is inactive (logic level "0"), then input D 120 is selected as the source of input data to the flop 200. In this first scenario, SEN 274 is driven to active (logic level "1") by inverter 282 and N-FETs 203 and 211 are turned on. At the same time, N-FETs 205 and 209 are turned off. Therefore, when SE 124 is inactive, a "1" applied to D 120 turns on N-FET 204, completing a conductive path from node "a" 266 to VGND 261. Instead, if SE 124 is inactive and a "0" is applied to D 120, then DN 270 is driven to a "1" by inverter 280, thereby turning on N-FET 212 and completing a conductive path from node "b" 267 to VGND 261. In a second scenario where SE 124 is active (logic level "1"), then input SI 122 (scan input) is selected as the source of input data to the flop 200. In this second scenario, SEN 274 is driven to inactive (logic level "0") by inverter 282 and N-FETs 203 and 211 are turned off. At the same time N-FETs 205 and 209 are turned on. Therefore, when SE is active, a "1" applied to SI 122 turns on N-FET 206, completing a conductive path from node "a" 266 to VGND 261. Instead, if SE 124 is active and a "0" is applied to SI 122, then SIN 272 is driven to a "1" by inverter 281, thereby turning on N-FET 210 and completing a conductive path from node "b" 267 to VGND 261. In both scenarios, nodes "a" 266 and "b" 267 each form a portion of a pull-down path from node "m1" 276 and node "m" 277, respectively.

N-FETs 201 and 207 each complete one of the two pull-down paths from "m1" 276 and "m" 277 to "a" 266 and "b" 267, respectively. N-FET 201 and P-FET 222 form a first inverter structure, with output node "m1" 276 and input node "m" 277. N-FET 207 and P-FET 224 form a second inverter structure, with output node "m" 277 and input node "m1" 276. The first and second inverter structures form a cross-coupled latch, with node "a" 266, node "b" 267, or neither providing a pull-down path. When turned on, P-FETs 221 and 223 are configured to pull nodes "m1" 276 and "m" 277, respectively, to VDD 262 (logic "1"), overriding any residual state on nodes "m1" 276 and "m" 277.

N-FET 202 is configured to pull node "a" 266 to VGND 261 when node "m1_n" 279 is driven to a "1" by inverter 285, which is controlled by node "m1" 276. N-FET 208 is configured to pull node "b" 267 to VGND 261 when node "m_n" 278 is driven to a "1" by inverter 286, which is controlled by node "m" 277.

Inverter 285 drives node "m1_n" 279 with a delayed, inverted representation of the value on node "m1" 276. When node "m1_n" 279 is driven to a "1," N-FETs 202 and 214 are turned on and P-FET 227 is turned off. Otherwise, when node "m1_n" 279 is driven to a "0," N-FETs 202 and 214 are turned off and P-FET 227 is turned on. Inverter 286 drives node "m_n" 278 with a delayed, inverted representation of the value on node "m" 277. When node "m_n" 278 is driven to a "1," N-FET 208 is turned on. Otherwise, when node "m_n" 278 is driven to a "0," N-FET 208 is turned off.

A buffered output latch structure is formed by P-FETs 225, 226, 227, N-FETs 214, 215, 216, and inverters 283 and 284. P-FETs 227, 226 and N-FETs 215, 216 form a first gated inverter structure, which is cross-coupled with inverter 284 to form a latch element. Inverter 283 inverts and buffers the value stored within the latch element to generate output Q 140 from flop 200.

In normal operation, clock input CLK 126 toggles between logic "0" and logic "1." When CLK 126 is driven with "0," the flop 200 is in a "pre-charge" state, illustrated below in FIG. 2B. When CLK 126 initially swings from "0" to "1," the flop 200 enters an initial evaluation state, illustrated below in FIG. 2C. After the initial evaluation state, the flop 200 proceeds into a mid-way evaluation state, illustrated in FIG. 2D. Once the states within the flop 200 have settled, the flop 200 enters a final evaluation state, illustrated in FIG. 2E.

FIGS. 2B through 2E illustrate a scenario where CLK 126 is initially driven to "0," Q 140 is driving a "0," and D 120 is driven to "1." This scenario illustrates the internal operation of the flop 200 while sampling a "1" on input data node D 120 and transitioning output node Q 140 from "0" to "1," to reflect the value of the newly sampled input data. N-FET and P-FET devices in FIGS. 2B through 2E that are turned on are shown bolded, while the remaining N-FET and P-FET devices are turned off.

Figure 2B:
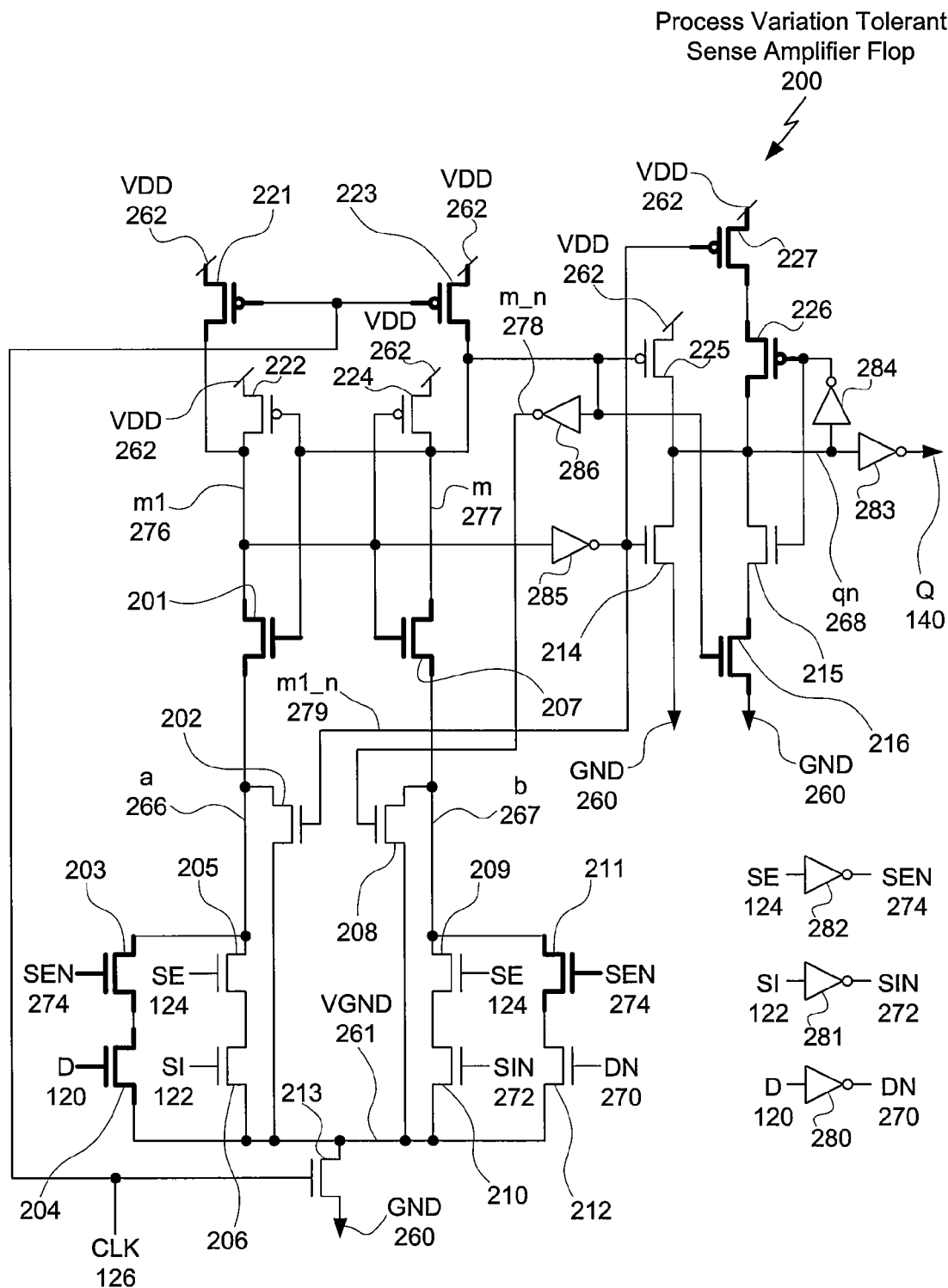
FIG. 2B illustrates pre-charge states of field-effect transistor devices within the process variation tolerant sense amplifier flop, according to one embodiment of the invention.

FIG. 2B illustrates pre-charge states of field-effect transistor devices within the process variation tolerant sense amplifier flop 200, according to one embodiment of the invention. Clock input CLK 126 is driven with a "0," causing N-FET 213 to turn off and P-FETs 221 and 223 to turn on. In this state, P-FET 221 pulls node "m1" 276 to VDD 262, causing N-FET 207 to turn on. Similarly, P-FET 223 pulls node "m" 277 to VDD 262, causing N-FET 201 to turn on. With "m1" 276 pulled to VDD 262, inverter 285 drives "m1_n" 279 to a logic "0," thereby turning on P-FET 227 and providing P-FET 226 a pull-up path to VDD 262. P-FET 226 pulls node "qn" 268 to logic "1" through P-FET 227, causing inverter 283 to drive Q 140 to the currently stored valued of "0." With "m" 277 pulled up, N-FET 216 is also turned on. However, N-FET 215 is not turned on, so there is no current running through N-FETs 215 or 216.

The scan enable input, SE 124, is disabled with a "0" input, causing inverter 282 to drive SEN 274 with a "1," which turns on N-FETs 203 and 211. D 120 is driven with a "1," causing N-FET 204 to turn on.

Figure 2C:
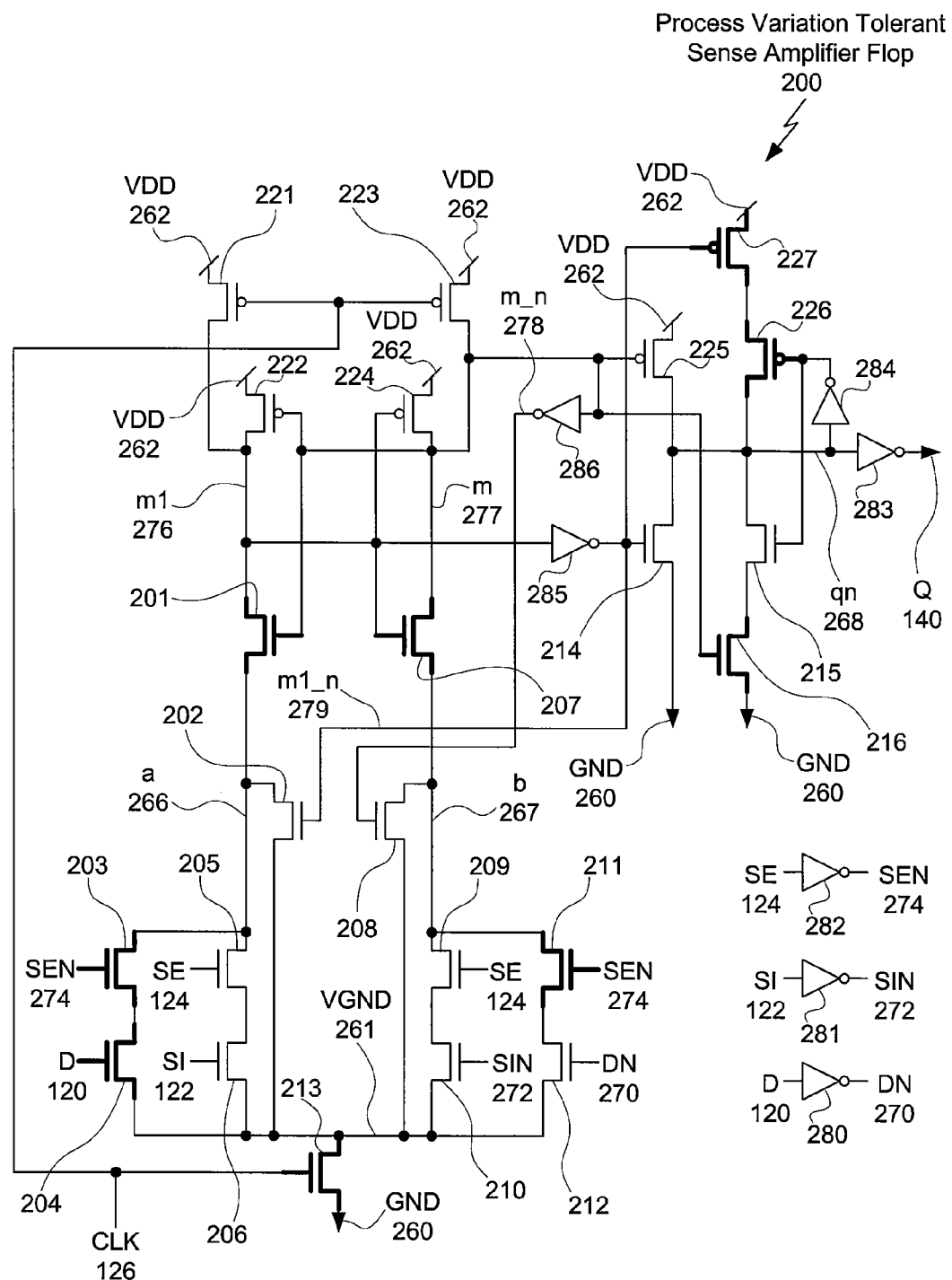
FIG. 2C illustrates initial evaluation states of field-effect transistor devices within the process variation tolerant sense amplifier flop, according to one embodiment of the invention.

FIG. 2C illustrates initial evaluation states of field-effect transistor devices within the process variation tolerant sense amplifier flop 200, according to one embodiment of the invention. During initial evaluation, the clock input CLK 126 is driven with a "1," causing N-FET 213 to turn on and P-FETs 221 and 223 to turn off.

At his point, P-FETs 221 and 223 are no longer pulling-up nodes "m1" 276 and "m" 277. Either "m1" 276 or "m" 277 may be subsequently pulled down by either N-FET 201 or N-FET 207, respectively. At this point, the scan enable input, SE 124, continues to be disabled with a "0" input, causing inverter 282 to drive SEN 274 with "1," which turns on N-FETs 203 and 211. Furthermore, D 120 continues to be driven with a "1," causing N-FET 204 to turn on. This specific configuration of device state creates a conductive path from GND 260 (logic "0") to node "m1" 276, which causes "m1" 276 to discharge to GND 260, while leaving node "m" 277 charged to VDD 262. Importantly, there is no pull-up activity on node "m1" 276 from either P-FET 221 or P-FET 222 at this point. Pull-up current from either P-FET 221 or P-FET 222 would be process variation dependent and could result in a malfunction of flop 200 if the P-FET pull-up current overpowered the pull-down current through N-FETs 201, 203, 204 and 213. Additionally, only N-FET 201 or N-FET 207 may be turned on at a given time, enabling only one selected path through the differential structure from VDD 262 to GND 260. This is in contrast to prior art designs, which typically allow two or more paths through a differential structure to be enabled simultaneously, leading to greater process variation sensitivity.

Figure 2D:
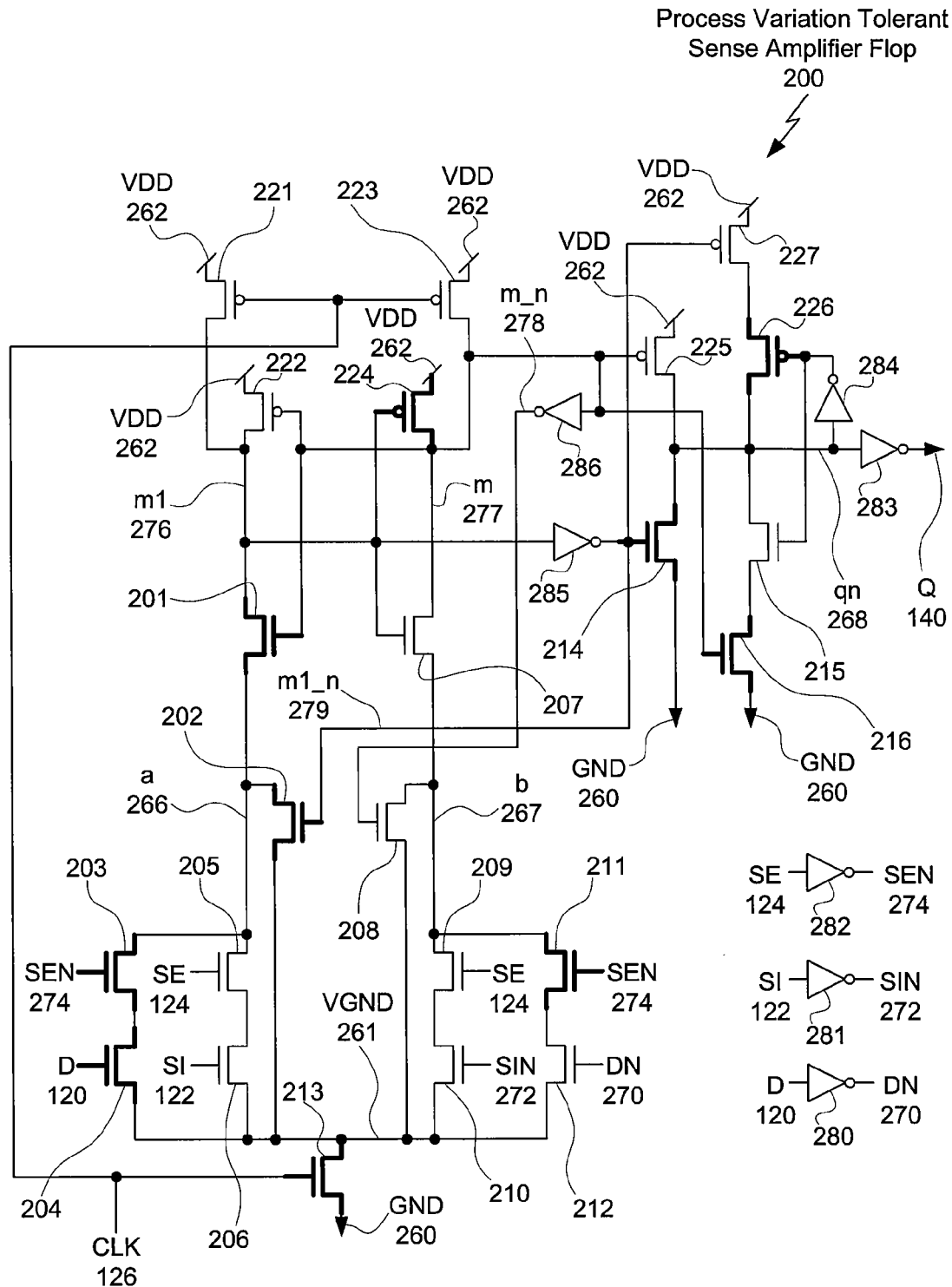
FIG. 2D illustrates mid-way evaluation states of field-effect transistor devices within the process variation tolerant sense amplifier flop, according to one embodiment of the invention.

FIG. 2D illustrates mid-way evaluation states of field-effect transistor devices within the process variation tolerant sense amplifier flop 200, according to one embodiment of the invention. During mid-way evaluation, the clock input CLK 126 remains driven with a "1," keeping N-FET 213 turned on P-FETs 221 and 223 turned off. Additionally, the "0" on "m1" 276 causes P-FET 224 to turn on, holding "m" 277 in a "1" state.

During mid-way evaluation, inverter 285 propagates the "1" to "0" transition on "m1" 276 as a "0" to "1" transition on "m1_n" 279. The "1" on "m1_n" 279 causes ID-FET 277 to turn off and N-FETs 202 and 214 to turn on. As N-FET 214 begins to turn on, a conductive path is formed from node "qn" 268 to GND 260, causing "qn" 268 to be pulled to "0." Importantly, P-FET 227 is turned off prior to N-FET 214 being turned on, eliminating any short-circuit current scenario where the process-dependent conductivity ratio between P-FET 227 and N-FET 214 needs to be tightly bounded for correct circuit function.

Figure 2E:
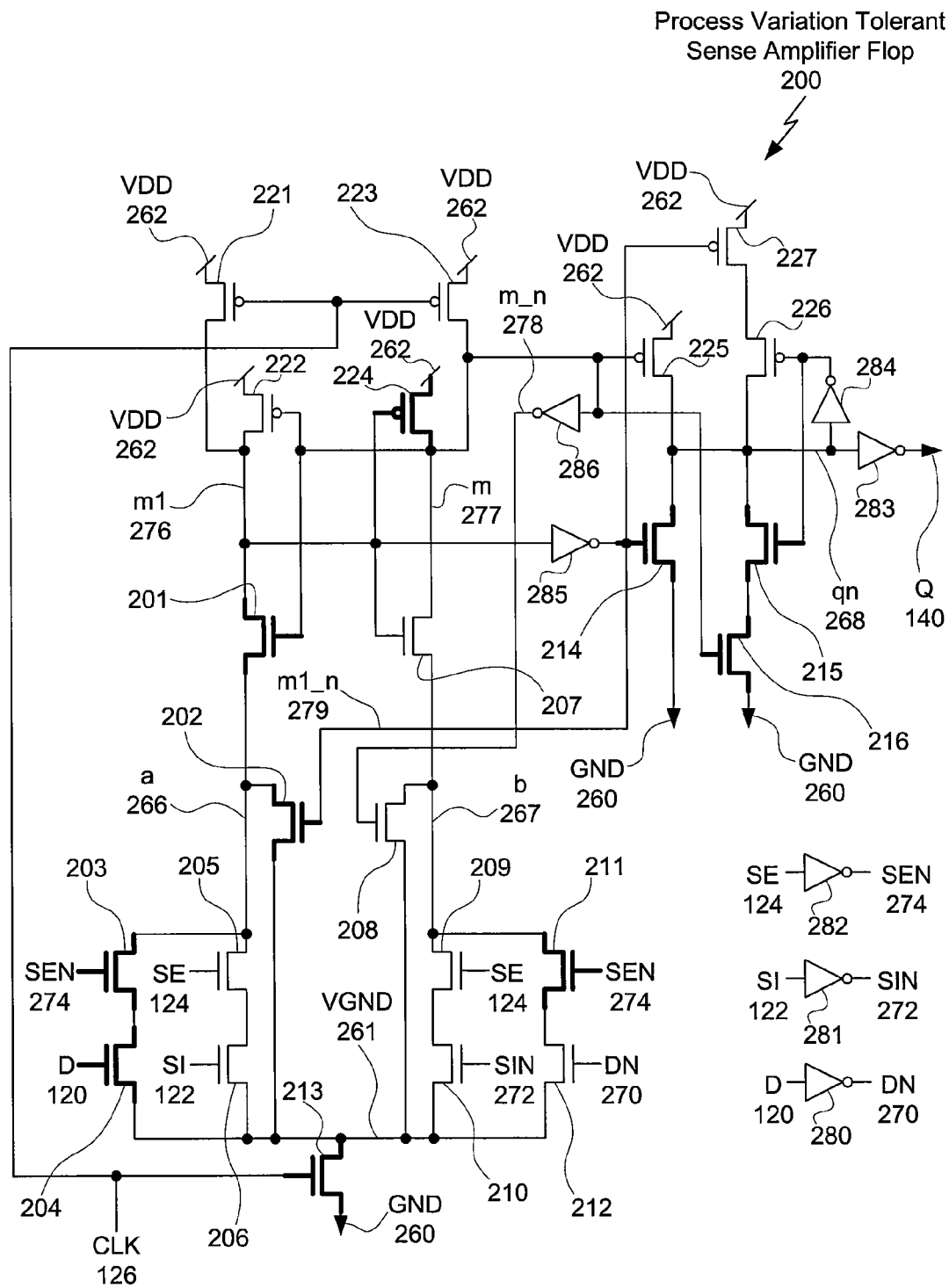
FIG. 2E illustrates final evaluation states of field-effect transistor devices within the process variation tolerant sense amplifier flop, according to one embodiment of the invention.

FIG. 2E illustrates final evaluation states of field-effect transistor devices within the process variation tolerant sense amplifier flop 200, according to one embodiment of the invention. During final evaluation, the clock input CLK 126 remains driven with a "1," keeping N-FET 213 turned on P-FETs 221 and 223 turned off. Additionally, the "0" on "m1" 276 causes P-FET 224 to remain on, holding "m" 277 in a "1" state.

During final evaluation, the "0" on "qn" 268 causes inverter 284 to propagate a "1" to the gate of P-FET 226 and the gate of N-FET 215, causing P-FET 226 to turn off and N-FET 215 to turn on. With the transition of node "qn" 268 from a "1" to a "0," inverter 283 drives output Q 140 from a "0" to a "1," reflecting the sampled input value on D 120.

Figure 3:
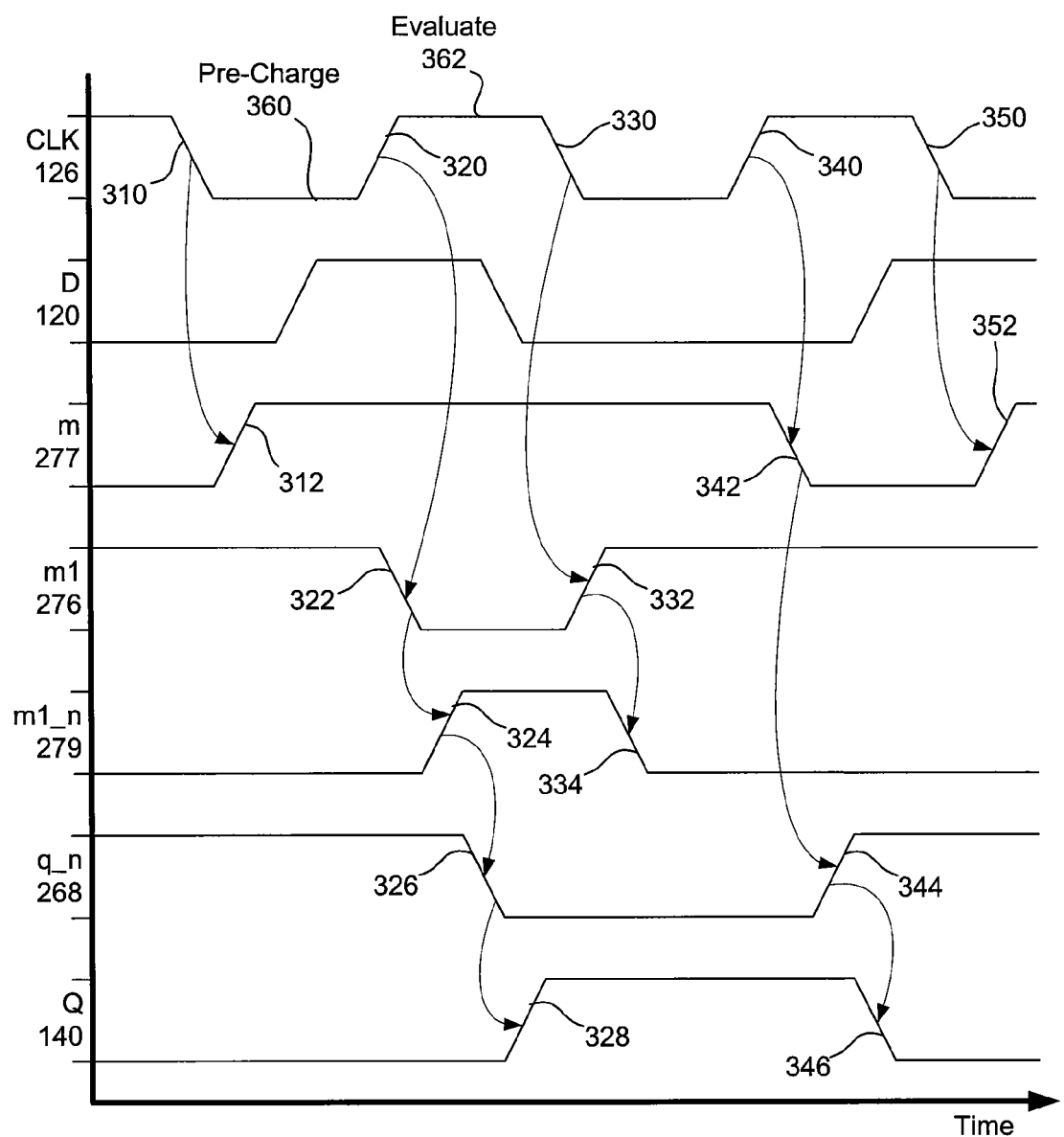
FIG. 3 illustrates the relative timing of certain nodes within a process variation tolerant sense amplifier flop, according to one embodiment of the invention.

FIG. 3 illustrates the relative timing of certain nodes within a process variation tolerant sense amplifier flop 200, according to one embodiment of the invention. The external nodes CLK 126, D 120, and Q 140 are shown, along with internal nodes "m" 277, "m1" 276, "m1_n" 279 and "q_n" 268. A transition in one signal may cause a transition in a second signal, with the causal relationship illustrated as an arc from the first signal to the second signal. When input CLK 126 is driven to "0," the flop 200 is in a pre-charge state, as described in FIG. 2B. When CLK transitions from a "0" to a "1," the flop 200 passes through the evaluation states described in FIGS. 2C through 2E.

As shown in this scenario, Q 140 is initially in a "0" state. At a first rising edge of CLK 126, flop 200 samples the "1" on input D 120. A propagation time later, the sampled value "1" is driven on output Q 140. At a second rising edge of CLK 126, flop 200 samples the "0" on input D 120. A propagation time later, the sampled value "0" is driven on output Q 140.

As previously discussed in FIG. 2B, a "0" on CLK 126 causes the flop 200 to enter a pre-charge state, with nodes "m" 277 and "m1" 276 being pulled up by P-FETS 223 and 221, respectively. Therefore, a falling edge 310 on CLK 126 results in a rising edge 312 on "m" 277. Node "m1" 276 is already in a "1" state and remains in the "1" state immediately after the falling edge 310. Some time after the falling edge 310, D 120 transitions from a "0" to a "1" in preparation to be sampled by flop 200 when a rising edge 320 arrives on CLK 126. Just prior to rising edge 320, both "m" 277 and "m1" 276 are pre-charged to "1." However, just after rising edge 320, "m1" is pulled down by a conductive path through N-FETs 201, 203, 204, and 213. If, instead, D 120 was driven to "0," node "m" 277 would be pulled down through N-FETs 207, 211, 212, and 213 and node "m1" 276 would remain in a "1" state.

With "m1" pulled down to "0," negative edge 322 is inverted through inverter 285 to generate positive edge 324 on node "m1_n" 279. Positive edge 324 causes N-FET 214 to turn on and pull down node "q_n" 268, resulting in negative edge 326. Importantly, N-FET 214 encounters no completing pull-up activity from either P-FET 225 or P-FETs 226 and 227 while pulling node "q_n" 268 down to "0." Negative edge 326 is inverted by inverter 283, which generates a positive edge 328 on Q 140.

A subsequent falling edge 330 of CLK 126 causes a rising edge 332 on node "m1" 276 as both "m1" 276 and "m" 277 are pulled up to VDD 262. Rising edge 332 is inverted by inverter 285, resulting in a negative edge 334 on node "m1_n" 279.

A second rising edge 340 on CLK 126 results in node "m" 277 being discharged to "0," through N-FETs 207, 211, 212 and 213. As node "m" 277 is discharged to "0," P-FET 225 is turned on, pulling node "q_n" 268 to "1," resulting in positive edge 344. Positive edge 344 is inverted by inverter 283, resulting in negative edge 346 on output Q 140. A subsequent negative edge 350 on CLK 126 causes node "m" 277 to be pulled up, resulting in positive edge 352, as flop 200 enters the pre-charge state.

Figure 4:
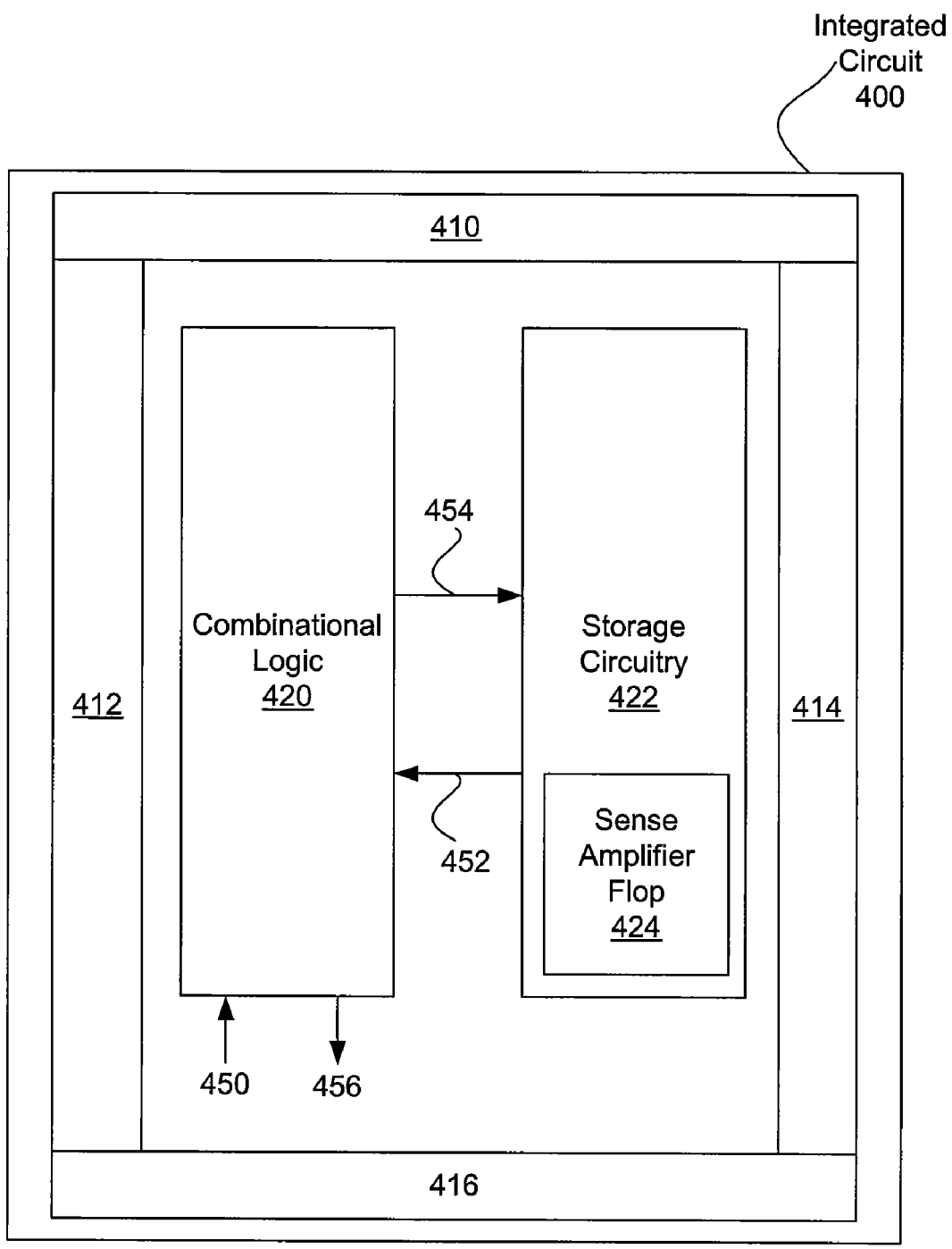
FIG. 4 depicts an integrated circuit, in which one or more aspects of the invention may be implemented.

FIG. 4 depicts an integrated circuit 400, in which one or more aspects of the invention may be implemented. The integrated circuit 400 includes input/output circuits 410, 412, 414 and 416. The integrated circuit 400 also includes combinational logic 420, and storage circuitry 422. The combinational logic 420 receives signals 450 and 452 as inputs and generates signals 454, 456 as outputs. The storage circuitry 422 receives signals 454 as inputs and stores certain values from the input signals 454. The storage circuitry 422 presents certain stored values as outputs on signals 452. In one embodiment, an instance of the sense amplifier flop 200 of FIG. 2 is instantiated within the storage circuitry 422 as a sense amplifier flop 424.

In sum, a sense amplifier flop design is disclosed that eliminates short-circuit currents between N-FETs and P-FETs by specifically staging transitions within the sense amplifier flop. By avoiding short-circuit currents within the flop, the need to tightly control N-FET versus P-FET conductivity is substantially reduced, thereby increasing overall tolerance of process variation.

While the forgoing is directed to embodiments of the present invention, other and further embodiments of the invention may be devised without departing from the basic scope thereof. For example, aspects of the present invention may be implemented in complementary symmetry metal-oxide semiconductor (CMOS) fabrication technology or other related fabrication technologies. Therefore, the scope of the present invention is determined by the claims that follow.

We claim:

1. A process variation tolerant sense amplifier flip-flop circuit, the circuit comprising:
a differential subsystem that includes a first path from a first intermediate node to ground, a second path from the first intermediate node to ground, a third path from a second intermediate node to ground, and a fourth path from the second intermediate node to ground; and
a control subsystem configured to control the second path to ground via a first N-channel field effect transistor (N-FET) and the third path to ground via a second N-FET, the control subsystem including:
a cross-coupled latch that is coupled to the first intermediate node and the second intermediate node and that is configured to produce a differential control signal at a first node and a second node;
a first inverter that is coupled to the first node and configured to produce a first delayed and inverted signal; and
a second inverter that is coupled to the second node and configured to produce a second delayed and inverted signal, wherein the first delayed and inverted signal and the second delayed and inverted signal are a delayed version of the differential control signal,
wherein the second path to ground is enabled based on the second delayed and inverted signal produced by the control subsystem and the third path to ground is enabled based on the first delayed and inverted signal produced by the control subsystem.

2. The circuit of claim 1, further comprising a buffered output latch that is coupled to the first node and the output of the second inverter and configured to produce an output signal representing a data input signal sampled on a rising clock edge, wherein the buffered output latch includes a first P-FET and a second P-FET that are serially connected and configured to provide a pull-up path to the supply voltage, and a third N-FET and a fourth N-FET that are serially connected and configured to provide a pull-down path to ground to produce the output signal.

3. The circuit of claim 2, wherein the first P-FET is disabled during the mid-way evaluation state to prevent a short circuit through the second P-FET to ground before a fifth N-FET in the buffered output latch is enabled.

4. The circuit of claim 1, wherein the first path to ground is enabled when the data input signal is high.

5. The circuit of claim 1, wherein a secondary input signal provides an alternative first path to ground when the circuit is operating in a scan mode.

6. The circuit of claim 1, wherein the fourth path to ground is enabled when the data input signal is low.

7. The circuit of claim 1, wherein a secondary inverted input signal provides an alternative fourth path to ground when the circuit is operating in a scan mode.

8. The circuit of claim 1, wherein, during a pre-charge state, the first node and the second node are pulled high.

9. The circuit of claim 8, wherein, during an initial evaluation state, the second node is pulled to ground through the first path to ground when the data input signal is high.

10. The circuit of claim 9, wherein, during the initial evaluation state, the first node is pulled to ground through the fourth path to ground when the data input signal is low.

11. The circuit of claim 9, wherein, during a mid-way evaluation state, the first node is pulled high when the data input signal is high.

12. The circuit of claim 11, wherein, during the mid-way evaluation state, the second path to ground is enabled, and the second node is pulled to ground through the second path to ground.

13. The circuit of claim 12, wherein, during the mid-way evaluation state, the first node is pulled to high through the cross-coupled latch.

14. The circuit of claim 13, wherein, during a final evaluation state, the gate of the fourth N-FET is driven high to enable the pull-down path to ground from the first node.

15. The circuit of claim 1, wherein the first N-FET and the second N-FET are not enabled during the initial evaluation state.

16. An integrated circuit, comprising:
combinational logic; and
storage circuitry coupled to the combinational logic and including a process variation tolerant sense amplifier flip-flop circuit having:
a differential subsystem that includes a first path from a first intermediate node to ground, a second path from the first intermediate node to ground, a third path from a second intermediate node to ground, and a fourth path from the second intermediate node to ground, and
a control subsystem configured to control the second path to ground via a first N-channel field effect transistor (N-FET) and the third path to ground via a second N-FET, the control subsystem including:
a cross-coupled latch that is coupled to the first intermediate node and the second intermediate node and that is configured to produce a differential control signal at a first node and a second node;
a first inverter that is coupled to the first node and configured to produce a first delayed and inverted signal; and
a second inverter that is coupled to the second node and configured to produce a second delayed and inverted signal, wherein the first delayed and inverted signal and the second delayed and inverted signal are a delayed version of the differential control signal,
wherein the second path to ground is enabled based on the second delayed and inverted signal produced by the control subsystem and the third path to ground is enabled based on the first delayed and inverted signal produced by the control subsystem.

17. The integrated circuit of claim 16, wherein, during an initial evaluation state, the second node located is pulled to ground through the first path to ground when data input signal is high and the first N-FET and the second N-FET are not enabled.

18. The integrated circuit of claim 17, wherein, during a mid-way evaluation state, the second path to ground is enabled, and the second node is pulled to ground through the second path to ground.

19. The integrated circuit of claim 16, further comprising a buffered output latch that is coupled to the first node and the output of the second inverter and configured to produce an output signal representing a data input signal sampled on a rising clock edge, wherein the buffered output latch includes a first P-FET and a second P-FET that are serially connected and configured to provide a pull-up path to the supply voltage, and a third N-FET and a fourth N-FET that are serially connected and configured to provide a pull-down path to ground to produce the output signal.

20. The circuit of claim 19, wherein the first P-FET is disabled during a mid-way evaluation state to prevent a short circuit through the second P-FET to ground before a fifth N-FET in the buffered output latch is enabled.

* * * * *